US008481868B2

(12) United States Patent
Dennes et al.

(10) Patent No.: US 8,481,868 B2
(45) Date of Patent: Jul. 9, 2013

(54) JUNCTION BOX

(75) Inventors: Wayne William Dennes, Wyoming (AU); Malcolm Bruce Brear, Empire Bay (AU)

(73) Assignee: ADC GmbH, Berlin (DE)

( * ) Notice: Subject to any disclaimer, the term of this patent is extended or adjusted under 35 U.S.C. 154(b) by 398 days.

(21) Appl. No.: 12/875,573

(22) Filed: Sep. 3, 2010

(65) Prior Publication Data

US 2011/0061926 A1 Mar. 17, 2011

(30) Foreign Application Priority Data

Sep. 9, 2009 (AU) ................................ 2009213018

(51) Int. Cl.
*H01L 23/48* (2006.01)
*H01R 4/24* (2006.01)
*H01R 11/20* (2006.01)

(52) U.S. Cl.
USPC .......................................... 174/549; 439/404

(58) Field of Classification Search
USPC .......................... 439/395, 399, 404; 174/549
See application file for complete search history.

(56) References Cited

U.S. PATENT DOCUMENTS

| | | | | |
|---|---|---|---|---|
| 4,668,039 A * | 5/1987 | Marzili | 439/404 |
| 5,009,612 A * | 4/1991 | Rishworth et al. | 439/403 |
| 5,199,899 A * | 4/1993 | Ittah | 439/403 |
| 5,338,220 A | 8/1994 | Soes et al. | |
| 5,435,747 A | 7/1995 | Franckx et al. | |
| 5,498,172 A | 3/1996 | Noda | |
| 5,961,341 A | 10/1999 | Knowles et al. | |
| 2008/0081507 A1 | 4/2008 | Mahajan | |
| 2009/0258533 A1 | 10/2009 | Dennes | |

FOREIGN PATENT DOCUMENTS

| | | |
|---|---|---|
| EP | 0 470 887 | 2/1992 |
| EP | 1 369 956 | 12/2003 |
| FR | 2 438 923 | 5/1980 |
| GB | 2 034 538 | 6/1980 |
| WO | WO 2007/128380 | 11/2007 |

* cited by examiner

*Primary Examiner* — Hung Ngo
(74) *Attorney, Agent, or Firm* — Merchant & Gould P.C.

(57) ABSTRACT

A junction box for electrically connecting insulated conductors of a first cable to corresponding insulated conductors of a second cable, including a terminal housing; a plurality of electrically conductive contacts extending through the terminal housing, each contact of said contacts including first and second insulation displacement contacts (IDCs) opening into respective first and second sides of the terminal housing; and first and second lid members operatively coupled to the terminal housing so that relative movement between the terminal housing and the lid members urges insulated conductors interposed therebetween into corresponding IDCs for electric connection to the contacts, wherein said relative movement electrically connects the insulated conductors of the first cable on the first side of said sides of the terminal housing to corresponding insulated conductors of the second cable on the second side of said sides of the terminal housing via the IDCs of common contacts.

16 Claims, 4 Drawing Sheets

JUNCTION BOX

This application claims benefit of Serial No. 2009213018, filed 9 Sep. 2009 in Australia and which application is incorporated herein by reference. To the extent appropriate, a claim of priority is made to the above disclosed application.

TECHNICAL FIELD OF THE INVENTION

The present invention relates to a junction box, and to a method of electrically connecting insulated conductors of a first cable to corresponding insulated conductors of a second cable.

BACKGROUND OF THE INVENTION

Junction boxes are typically used to electrically connect the insulated conductors of a first cable to corresponding insulated conductors of a second cable. Junction boxes have previously used screw terminal connections to effect electric connections between corresponding pairs of insulated conductors. The following steps are typically performed in that regard:

a. stripping the sheath off end sections of the cables to expose the insulated conductors;
b. stripping the insulation off end sections of the insulated conductors to expose the copper conductors;
c. twisting the pairs of conductors together;
d. inserting the pairs of conductors into corresponding screw connectors; and
e. tightening the screw connectors to secure the electric connections.

It may be generally inconvenient and/or labour intensive to connect insulated conductors to a junction box in the above described manner.

The above-described junction box is limited to effecting electric connections between insulated conductors of end sections of cables. It may be generally desirable to electrically connect the insulated conductors of an end section of a first cable to the insulated conductors of a mid section of a second cable. Further, it may be generally desirable to electrically connect the insulated conductors of a mid section of a first cable to the insulated conductors of a mid section of a second cable.

It is generally desirable to overcome or ameliorate one or more of the above mentioned difficulties, or at least provide a useful alternative.

SUMMARY OF THE INVENTION

In accordance with one aspect of the invention, there is provided a junction box for electrically connecting insulated conductors of a first cable to corresponding insulated conductors of a second cable, including:

(a) a terminal housing;
(b) a plurality of electrically conductive contacts extending through the terminal housing, each contact of said contacts including first and second insulation displacement contacts (IDCs) opening into respective first and second sides of the terminal housing; and
(c) first and second lid members operatively coupled to the terminal housing so that relative movement between the terminal housing and the lid members urges insulated conductors interposed therebetween into corresponding IDCs for electric connection to the contacts, wherein said relative movement electrically connects the insulated conductors of the first cable on the first side of said sides of the terminal housing to corresponding insulated conductors of the second cable on the second side of said sides of the terminal housing via the IDCs of common contacts.

Preferably, the lid members are operatively coupled to the terminal housing by hinges.

Preferably, the first and second lid members include a plurality of channels, for locating the insulated conductors for engagement with corresponding IDCs of said contacts.

Preferably, the channels are shaped to at least partially receive and seat therein an insulated conductor of a cable.

In accordance with another aspect of the invention, there is provided a method of electrically connecting insulated conductors of a first cable to corresponding insulated conductors of a second cable using a junction box, including the steps of:

(a) interposing insulated conductors of the first cable between a first side of said sides of the terminal housing;
(b) interposing insulated conductors of the second cable between a second side of said sides of the terminal housing; and
(c) moving the lid members with respect to the terminal housing so as to urge insulated conductors interposed therebetween into corresponding IDCs for electric connection to the contacts.

In accordance with another aspect of the invention, there is provided a method of electrically connecting insulated conductors of a first cable to corresponding insulated conductors of a second cable using a junction box, including the steps of:

(a) arranging insulated conductors of the first cable in channels of a first one of said lid members;
(b) arranging insulated conductors of the second cable in channels of a second one of said lid members; and
(c) moving the lid members with respect to the terminal housing so as to urge insulated conductors into corresponding IDCs for electric connection to the contacts.

Preferably, the insulated conductors of the first cable extend from an end section of the first cable into the channels of the first one of said lid members.

Preferably, the insulated conductors of the second cable extend from an end section of the second cable into the channels of the second one of said lid members.

Preferably, the insulated conductors of the first cable extend between lateral section sections of the first cable.

Preferably, the insulated conductors of the second cable extend between lateral section sections of the second cable.

BRIEF DESCRIPTION OF THE DRAWINGS

Preferred embodiments of the present invention are hereafter described, by way of non-limiting example only, with reference to the accompanying drawing in which.

DETAILED DESCRIPTION OF PREFERRED EMBODIMENTS OF THE INVENTION

Figure 7:
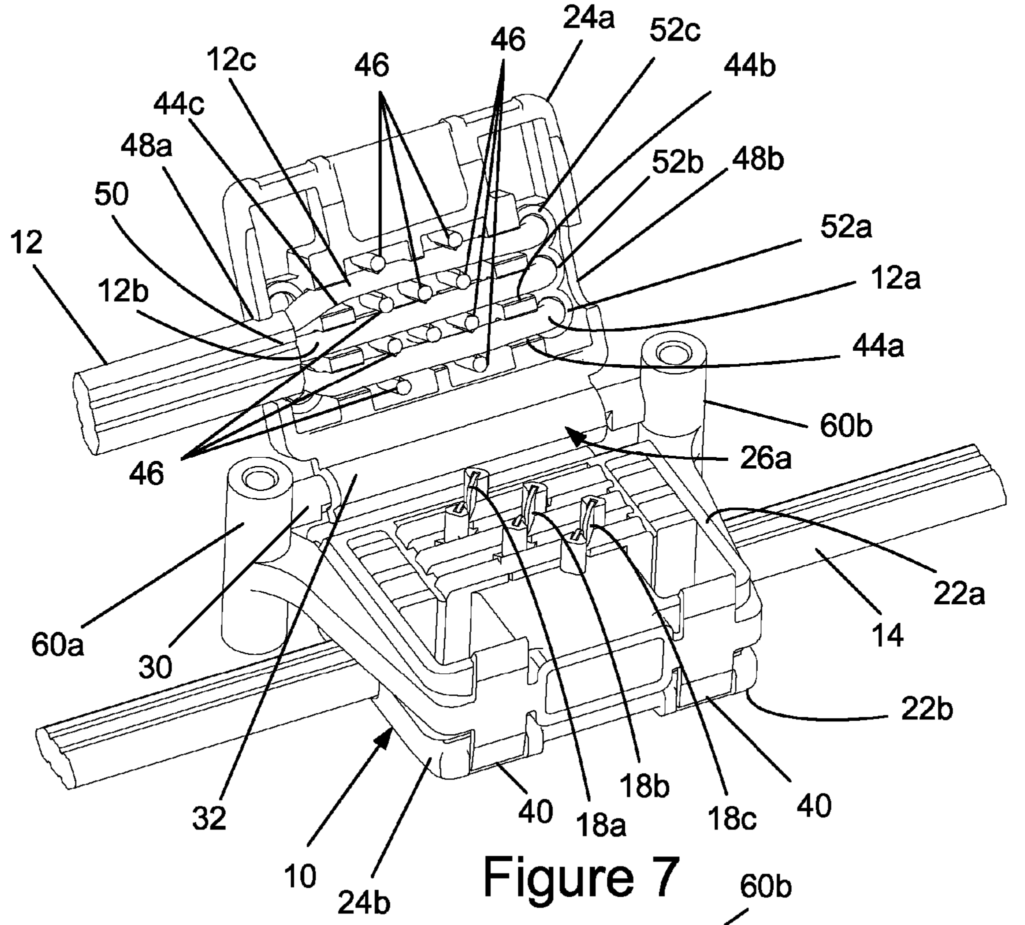
FIG. 7 is a front perspective view of the junction box shown in FIG. 6 arranged in another condition of use.
Figure 8:
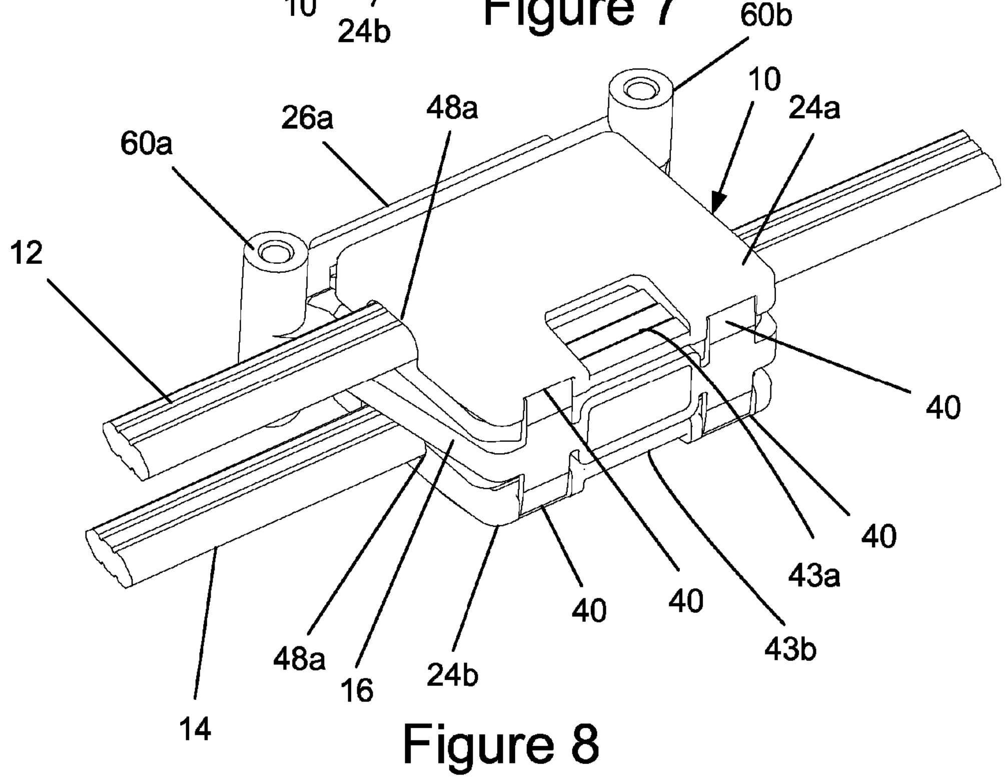
FIG. 8 is a front perspective view of the junction box shown in FIG. 7 arranged in another condition of use.
Figure 9:
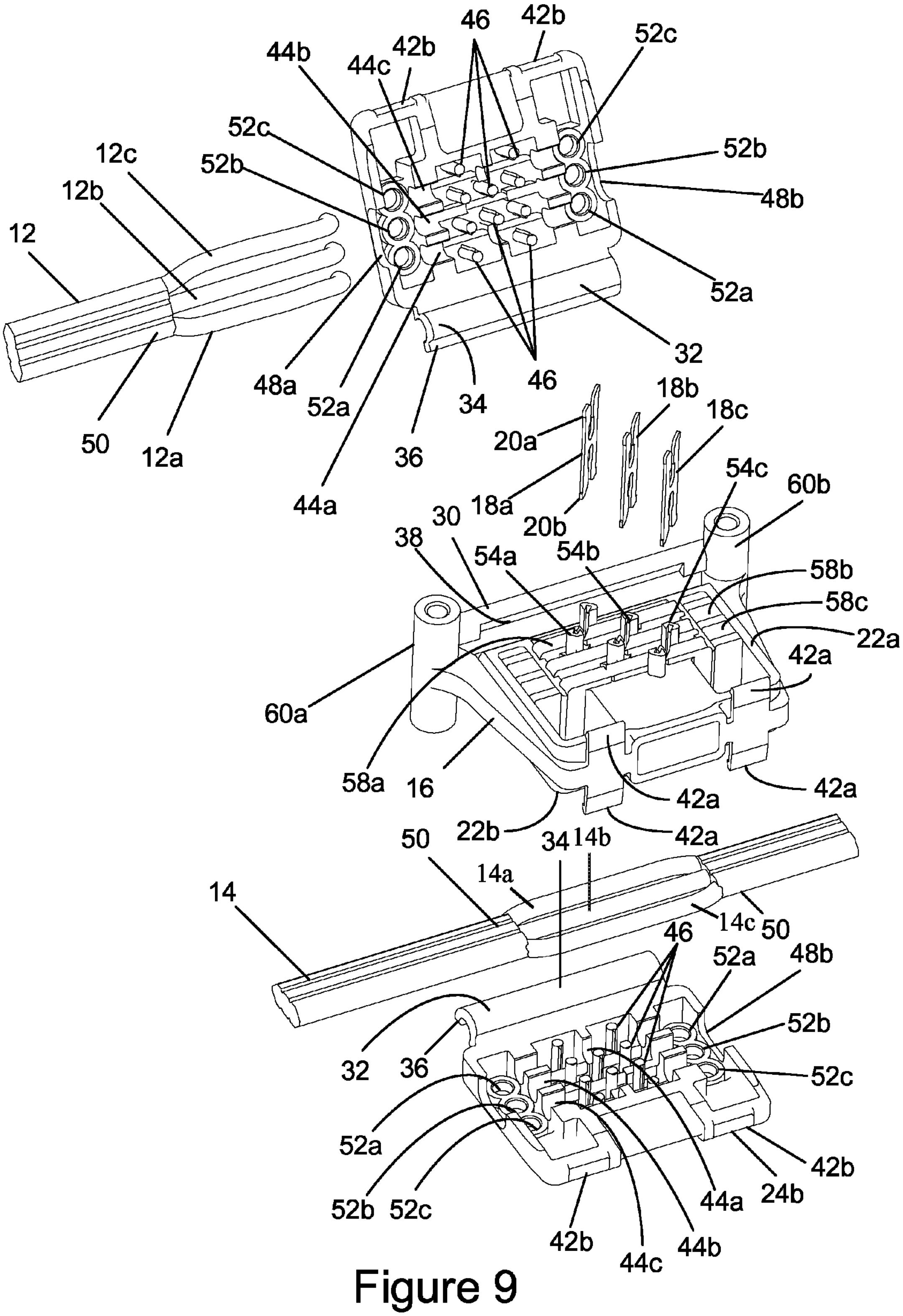
FIG. 9 is an exploded view of the junction box shown in FIG. 8.

The junction box 10 shown in FIGS. 1 to 9 is used to electrically connect insulated conductors 12*a*, 12*b*, 12*c* of a first cable 12 to corresponding insulated conductors 14*a*, 14*b*, 14*c* of a second cable 14. The junction box 10 can be used to quickly and easily electrically connect:

- a. insulated conductors 12*a*, 12*b*, 12*c* of an end of one cable 12 to corresponding insulated conductors 14*a*, 14*b*, 14*c* of a lateral section of another cable 14, as shown in FIGS. 7 to 9; and
- b. insulated conductors of a lateral section of one cable with corresponding insulated conductors of a lateral section of another cable (not shown); and
- c. connect insulated conductors of an end of one cable to corresponding insulated conductors of an end of another cable (not shown).

The junction box 10 includes a terminal housing 16 and a plurality of electrically conductive contacts 18*a*, 18*b*, 18*c* extending through the terminal housing 16. As particularly shown in FIGS. 5 and 9, each one of the contacts including 18*a*, 18*b*, 18*c* includes first and second insulation displacement contacts (IDCs) 20*a*, 20*b* opening into respective first and second sides 22*a* 22*b* of the terminal housing 16. The junction box 10 also includes first and second lid members 24*a*, 24*b* operatively coupled to the housing so that relative movement between the terminal housing 16 and the lid members 24*a*, 24*b* urges insulated conductors 12*a*, 12*b*, 12*c*, 14*a*, 14*b*, 14*c* interposed therebetween into corresponding IDCs 20*a*, 20*b* for electric connection to the contacts 18*a*, 18*b*, 18*c*. The relative movement thereby electrically connects insulated conductors 12*a*, 12*b*, 12*c* of the first cable 12 on the first side 22*a* of the terminal housing 16 to corresponding insulated conductors 14*a*, 14*b*, 14*c* of the second cable 14 on the second side 22*b* of the terminal housing 16 via the IDCs 20*a*, 20*b* of common contacts 18*a*, 18*b*, 18*c*.

A technician can use the junction box 10 to electrically connect insulated conductors 12*a*, 12*b*, 12*c* of the first cable 12 to corresponding insulated conductors 14*a*, 14*b*, 14*c* of a second cable 14 by performing the steps of:

- a. interposing insulated conductors 12*a*, 12*b*, 12*c* of the first cable 12 between the first side 22*a* of the terminal housing 16 and the first lid member 24*a;*
- b. interposing insulated conductors 14*a*, 14*b*, 14*c* of the second cable 14 between the second side 22*b* of the terminal housing 16 and the second lid member 24*b*; and
- c. moving the lid members 24*a*, 24*b* with respect to the terminal housing 16 so as to urge insulated conductors 12*a*, 12*b*, 12*c*, 14*a*, 14*b*, 14*c* interposed therebetween into corresponding IDCs 20*a*, 20*b* for electric connection to the contacts 18*a*, 18*b*, 18*c*.

The lid members 24*a*, 24*b* are generally rectangular in shape and generally overlie respective first and second sides 22*a*, 22*b* of the terminal housing 16 when arranged in closed conditions of use. The lid members 24*a*, 24*b* thereby electrically isolate the contacts 18*a*, 18*b*, 18*c* when arranged in the closed condition of use.

Figure 1:
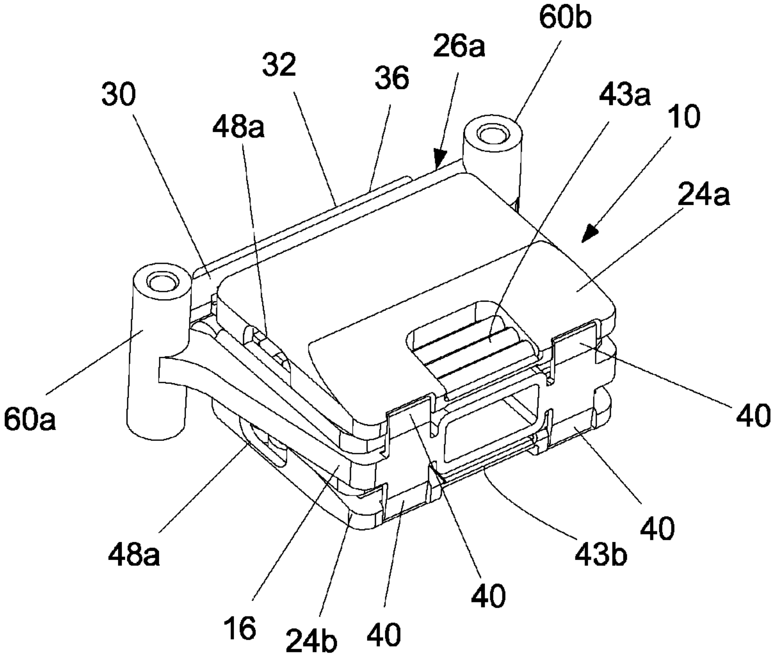
FIG. 1 is a front perspective view of a junction box.
Figure 2:
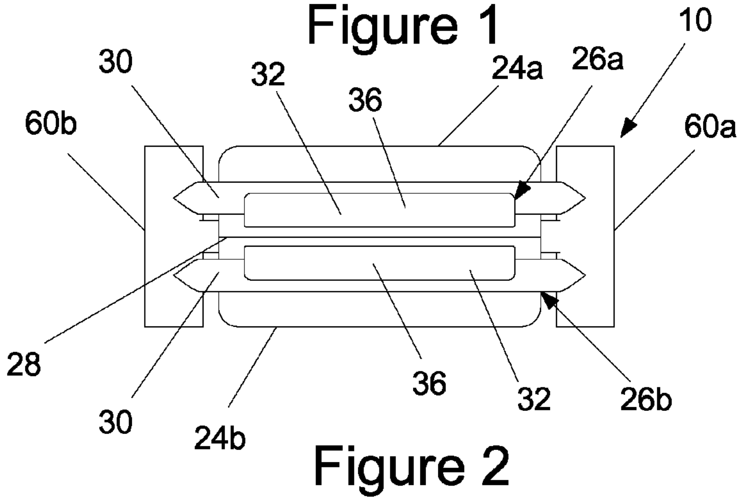
FIG. 2 is a back view of the junction box shown in FIG. 1.
Figure 3:
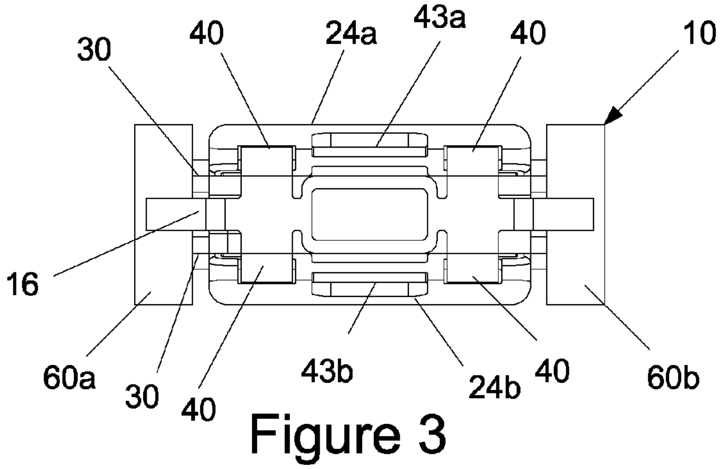
FIG. 3 is a front view of the junction box shown in FIG. 1.

As particularly shown in FIGS. 2 and 11, the lid members 24*a*, 24*b* are operatively connected to a common end 28 of the terminal housing 16 by hinges 26*a*, 26*b*. Each hinge 26*a*, 26*b* includes an axle 30 coupled to the common end 28 of the terminal housing 16 and a tongue member 32 coupled to the lid member 26*a*, 26*b*. The tongue member 32 includes a generally semicircular articular surface 34 which is shaped to slide around the axle 30 as the lid member 24*a*, 24*b* moves between open and closed conditions of use. The tongue member 32 also includes a flange member 36 which abuts the terminal housing 16 after a certain degree of rotation of the lid member 24*a*, 24*b* away from the terminal housing 16. The flange member 36 thereby limits the extent of rotation of the lid member 24*a*, 24*b* with respect to the terminal housing 16. In the example shown, the axle 30 includes a recess 38 which facilitates insertion of the tongue 32 during coupling of the lid member 24*a*, 24*b* to the terminal housing 16.

The junction box 10 includes fasteners 40 for securing the lid members 24*a*, 24*b* in the closed positions shown in FIGS. 1 to 4. The fasteners 40 preferably include corresponding male and female clips 42*a*, 42*b* which snap lock together when the lid members 24*a*, 24*b* are closed against respective sides 22*a*, 22*b* of the terminal housing 16. Alternatively, any suitable fastener 40 can be used to secure the lid members 24*a*, 24*b* in a closed condition of use. The lid members 24*a*, 24*b* preferably open and terminate independently with pliers. The lid members 24*a*, 24*b* includes recessed sections 43*a*, 43*b* shaped to engage distal ends of pliers.

Figure 4:
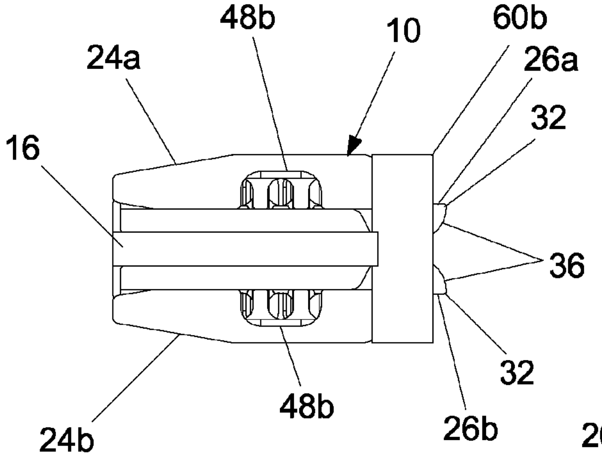
FIG. 4 is a side view of the junction box shown in FIG. 1.
Figure 5:
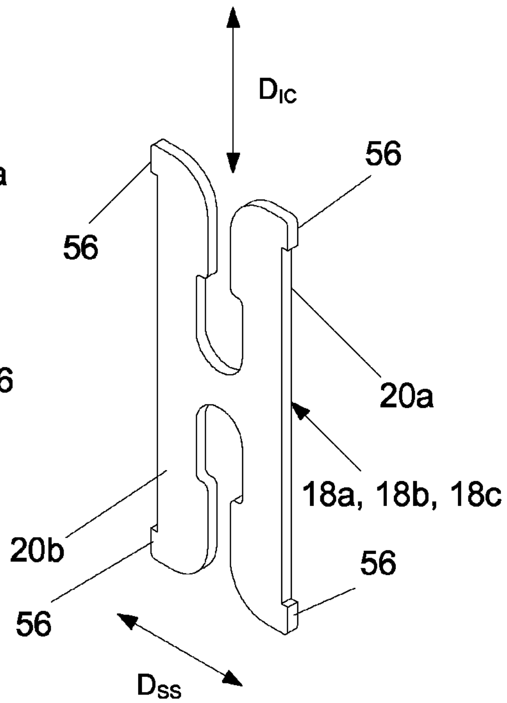
FIG. 5 is a front perspective view of a contact of the junction box shown in FIG. 1.

As particularly shown in FIG. 4, outer peripheral surfaces of the lid members 24*a*, 24*b* are preferably tapered away from the hinges 26*a*, 26*b* so that the junction box 10 can more easily slide under wiring in a wiring installation, for example. The lid members 24*a*, 24*b* are preferably transparent so that the insulated conductors 12*a*, 12*b*, 12*c*, 14*a*, 14*b*, 14*c* can be viewed through the lid members 24*a*, 24*b* when they are closed. It is thereby possible to view the connections to ensure that the insulated conductors are in correct positions.

Figure 6:
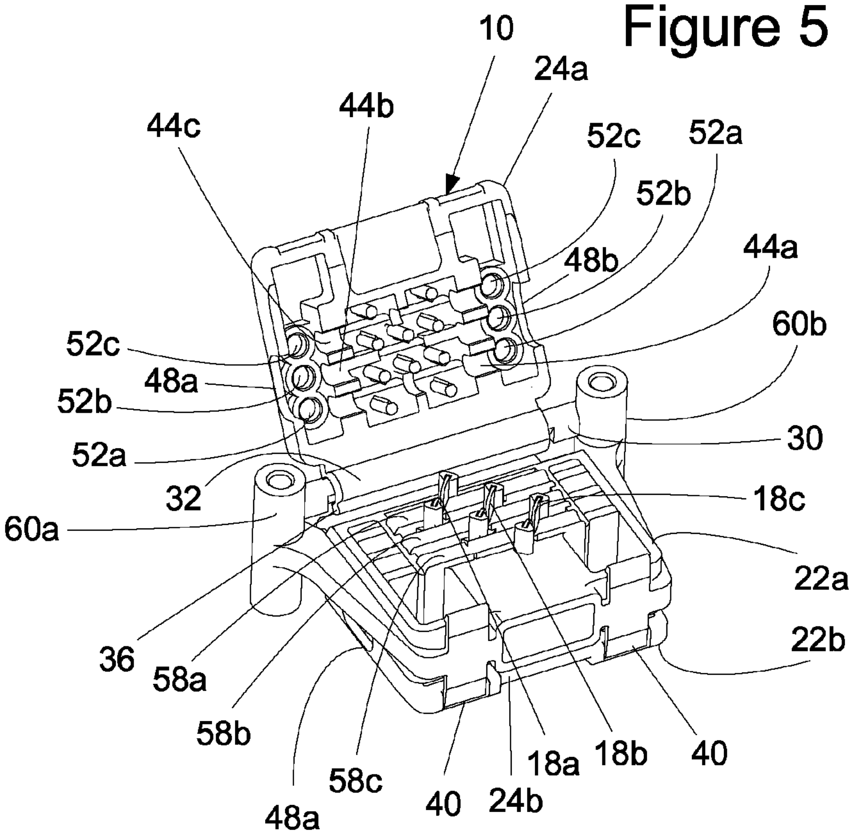
FIG. 6 is a top perspective view of the junction box shown in FIG. 1 arranged in another condition of use.

As particularly shown in FIGS. 6, 7 and 9, the first and second lid members 24*a*, 24*b* include a plurality of channels 44*a*, 44*b*, 44*c* for locating the insulated conductors 12*a*, 12*b*, 12*c*, 14*a*, 14*b*, 14*c* for engagement with corresponding IDCs 20*a*, 20*b*. The channels 44*a*, 44*b*, 44*c* are shaped to at least partially receive, and seat therein, lateral sections of respective ones of the insulated conductors 12*a*, 12*b*, 12*c*, 14*a*, 14*b*, 14*c* of the cables 12, 14 in the manner shown in FIG. 7, for example. The channels 44*a*, 44*b*, 44*c* inhibit lateral movement of the insulated conductors 12*a*, 12*b*, 12*c*, 14*a*, 14*b*, 14*c*. The channels 44*a*, 44*b*, 44*c* also include strain relief ribs 46 arranged to engage and inhibit movement of the insulated conductors 12*a*, 12*b*, 12*c*, 14*a*, 14*b*, 14*c* when they are located in the channels 44*a*, 44*b*, 44*c*.

As above-mentioned, the junction box 10 can be used to electrically connect insulated conductors 12*a*, 12*b*, 12*c*, 14*a*, 14*b*, 14*c* of cables in a number of different configurations. To facilitate this, the lid members 24*a*, 24*b* each include two openings 48*a*, 48*b* arranged at opposite ends of the channels 44*a*, 44*b*, 44*c*, the openings 48*a*, 48*b* being shaped to receive end sections 50 of the cables 12, 14. In the arrangement shown in FIG. 7, the opening 48*a* of first lid member 24*a* accommodates an end section 50 of the first cable 12 so that insulated conductors 12*a*, 12*b*, 12*c* extending from the end section 50 of the cable 12 feed into the channels 44*a*, 44*b*, 44*c*. Alternatively, the insulated conductors 12*a*, 12*b*, 12*c* of the cable 12 could be feed into the channels 44*a*, 44*b*, 44*c* from the opposite side via the opening 48*b*. The lid members 24*a*, 24*b* include termination holes 52*a*, 52*b*, 52*c* arranged at opposite ends of the channels 44*a*, 44*b*, 44*c* for receiving and electrically isolating terminal end sections of the insulated conductors 12*a*, 12*b*, 12*c*. Also as shown in FIG. 9, the cable 14 extends through both openings 48*a*, 48*b* of the lid member 24*b*. In this arrangement, the insulated conductors 14*a*, 14*b*, 14*c* are separated from a sheath of the cable 14 so that they can be arranged in respective channels 44*a*, 44*b*, 44*c*. The insulated conductors 12*a*, 12*b*, 12*c* of an end section 50 of the first cable 12 are thereby electrically connected to corresponding insulated conductors 14*a*, 14*b*, 14*c* of the a lateral section of the second cable 14.

Alternatively, the junction box 10 can be used to electrically connect insulated conductors 12*a*, 12*b*, 12*c* of a lateral section of the first cable 12 with corresponding insulated conductors 14*a*, 14*b*, 14*c* of a lateral section of the second cable 14; or to electrically connect insulated conductors 12*a*, 12*b*, 12*c* of an end section 50 of the first cable 12 with corresponding insulated conductors 14*a*, 14*b*, 14*c* of an end section of the second cable 14.

As particularly shown in FIG. 9, the contacts 18*a*, 18*b*, 18*c* are seated in contact mounts 54*a*, 54*b*, 54*c* that extend through terminal housing 16. The contacts 18*a*, 18*b*, 18*c* include anchors 56 arranged to frictionally engage the mounts 54*a*, 54*b*, 54*c*. The mounts 54*a*, 54*b*, 54*c* inhibit displacement of the bifurcated IDCs 20*a*, 20*b* during insertion of the insulated conductors 12*a*, 12*b*, 12*c*, 14*a*, 14*b*, 14*c*. A good quality electric connection is thereby effected as the insulated conductors 12*a*, 12*b*, 12*c*, 14*a*, 14*b*, 14*c* are urged into the IDCs 20*a*, 20*b* as the lid members 24*a*, 24*b* mover towards the closed condition of use. The IDCs 20*a*, 20*b* engage the insulated conductors 12*a*, 12*b*, 12*c*, 14*a*, 14*b*, 14*c* at an angle of 45 degrees to a direction of extent $D_{IC}$ of the insulated conductors 12*a*, 12*b*, 12*c*, 14*a*, 14*b*, 14*c*. That is, a side to side direction $D_{SS}$ of the IDCs 20*a*, 20*b* is substantially 45 degrees to the direction of extent $D_{IC}$ of the insulated 12*a*, 12*b*, 12*c*, 14*a*, 14*b*, 14*c*.

The first and second sides 22*a*, 22*b* of the terminal housing 16 include a plurality of channels 58*a*, 58*b*, 58*c* shaped to receive the insulated conductors 12*a*, 12*b*, 12*c*, 14*a*, 14*b*, 14*c* as they are forced into respective IDCs 20*a*, 20*b*. The extent to which the insulated conductors 12*a*, 12*b*, 12*c*, 14*a*, 14*b*, 14*c* can be forced into the IDCs 20*a*, 20*b* is limited by these channels 58*a*, 58*b*, 58*c*. The channels 44*a*, 44*b*, 44*c* and the channels 58*a*, 58*b*, 58*c* engage lateral sections of the insulated conductors 12*a*, 12*b*, 12*c*, 14*a*, 14*b*, 14*c* and thereby inhibit their movement.

The junction box 10 includes mounting bosses 60*a*, 60*b* for securing the junction box to a structural support with a fastener such as a nail or a screw.

The first cable 12 and the second cable 14 are preferably power cables, each including three insulated conductors 12*a*, 12*b*, 12*c*, 14*a*, 14*b*, 14*c*. Alternatively, any suitable cable including insulated conductors could be used. The junction box 10 can be used to terminate 1 to 2.5 $mm^2$ insulated conductors, for example. The junction box 10 can also preferably be used for other insulated conductor sizes, either smaller or larger. Mismatched wire sizes can be terminated.

The junction box 10 provides an insulated connection of the cables without the need for an additional plastic enclosure. The junction box 10 advantageously improves the speed of effecting electric connection of insulated conductors of cables. Individual insulated conductors are not required to be stripped before connection.

The overall size of the junction box 10 is preferably 73 mm long×49 mm wide×28 mm high.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

Throughout this specification, unless the context requires otherwise, the word "comprise", and variations such as "comprises" and "comprising", will be understood to imply the inclusion of a stated integer or step or group of integers or steps but not the exclusion of any other integer or step or group of integers or steps.

LIST OF PARTS

Junction box
12 Cable
12*a*, 12*b*, 12*c* Insulated conductor
14 Cable
14*a*, 14*b*, 14*c* Insulated conductor
16 Terminal housing
18*a*, 18*b*, 18*c* Contact
20*a*, 20*b* Insulation displacement contact
22*a*, 22*b* Side of terminal housing
24*a*, 24*b* Lid member
26*a*, 26*b* Hinge
28 Common end of terminal housing
30 Axle
32 Tongue
34 Articular surface of tongue
36 Flange member
38 Recess
40 Fastener
42*a*, 42*b* Male and female clips parts
43*a*, 43*b* Recessed section
44*a*, 44*b*, 44*c* Channel
46 Strain relief rib
48*a*, 48*b* Opening
50 Ens section of cable
52*a*, 52*b*, 52*c* Termination holes
54*a*, 54*b*, 54*c* Contact mounts
56 Anchor
58 Channel
60*a*, 60*b* Boss

The invention claimed is:

1. A junction box for electrically connecting insulated conductors of a first cable to corresponding insulated conductors of a second cable, comprising:
(a) a terminal housing;
(b) a plurality of electrically conductive contacts extending through the terminal housing, each contact of said contacts including first and second insulation displacement contacts (IDCs) opening into respective first and second sides of the terminal housing; and
(c) first and second lid members operatively coupled to the terminal housing so that relative movement between the terminal housing and the lid members urges insulated conductors interposed therebetween into corresponding IDCs for electric connection to the contacts,
wherein said relative movement electrically connects the insulated conductors of the first cable on the first side of said sides of the terminal housing to corresponding insulated conductors of the second cable on the second side of said sides of the terminal housing via the IDCs of common contacts;
wherein the first and second lid members include a plurality of channels for locating the insulated conductors for engagement with corresponding IDCs of said contacts;
wherein the first and second lid members each include an opening adjacent an end of the channels, the opening being shaped to receive an end section of a cable; and
wherein the first and second lid members include termination holes arranged at another end of the channels for receiving and electrically isolating terminal end sections of the insulated conductors.

2. The junction box claimed in claim 1, wherein the first and second lid members are operatively coupled to the terminal housing by hinges.

3. The junction box claimed in claim 1, wherein each of the channels is shaped to at least partially receive and seat therein an insulated conductor of a cable.

4. The junction box claimed in claim 1, wherein the channels inhibit lateral movement of the insulated conductors.

5. The junction box claimed in claim 1, including strain relief ribs arranged to engage and inhibit movement of the insulated conductors.

6. The junction box claimed in claim 1, wherein the opening of each one of said lid members accommodates an end section of a cable so that insulated conductors extend from the end section of the cable into the channels.

7. The junction box claimed in claim 1, wherein the first and second lid members each include a pair of openings adjacent opposite ends of the channels, shaped to receive respective end sections of a cable extending therethrough.

8. The junction box claimed in claim 7, wherein each pair of openings is positioned so that the insulated conductors extend between the end sections of the cable via the channels.

9. The junction box claimed in claim 1, wherein the IDCs engage the insulated conductors at an angle of 45 degrees to a direction of extent of the insulated conductors.

10. The junction box claimed in claim 1, including mounting bosses for securing the junction box to a structural support with a fastener.

11. The junction box claimed in claim 10, wherein the fastener is a nail or a screw.

12. The junction box claimed in claim 1, wherein the first and second lid members are substantially transparent so that the insulated conductors can be viewed therethrough.

13. The junction box claimed in claim 1, including fasteners for securing the first and second lid members in a closed condition of use over respective sides of the terminal housing.

14. The junction box claimed in claim 13, wherein the fasteners are clips.

15. The junction box claimed in claim 1, wherein an outer peripheral side of each one of said first and second lid members is tapered.

16. The junction box claimed in claim 1, wherein the first cable and the second cable are power cables, each including three insulated conductors.

* * * * *